United States Patent
Cheng et al.

(10) Patent No.: US 11,048,651 B2
(45) Date of Patent: Jun. 29, 2021

(54) METHOD OF MEMORY TIME DIVISION CONTROL AND RELATED DEVICE

(71) Applicant: Realtek Semiconductor Corp., HsinChu (TW)

(72) Inventors: Ching-Sheng Cheng, Hsinchu (TW); Wen-Wei Lin, Hsinchu County (TW); Kuan-Chia Huang, New Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/744,202

(22) Filed: Jan. 16, 2020

(65) Prior Publication Data

US 2021/0026789 A1   Jan. 28, 2021

(30) Foreign Application Priority Data

Jul. 22, 2019 (TW) ................................ 108125763

(51) Int. Cl.
*G06F 13/16* (2006.01)
*G11C 11/4076* (2006.01)
*G11C 8/18* (2006.01)
*G06F 12/02* (2006.01)

(52) U.S. Cl.
CPC ...... *G06F 13/1689* (2013.01); *G06F 12/0246* (2013.01); *G06F 13/161* (2013.01); *G11C 8/18* (2013.01); *G11C 11/4076* (2013.01)

(58) Field of Classification Search
CPC ............... G06F 13/1689; G06F 13/161; G06F 12/0246; G11C 11/4076; G11C 8/18; G11C 7/1042; G11C 7/1066; G11C 7/1093; G11C 11/4093
See application file for complete search history.

(56) References Cited

U.S. PATENT DOCUMENTS

| | | | |
|---|---|---|---|
| 2011/0208906 A1* | 8/2011 | Gillingham | H01L 25/0657 711/105 |
| 2014/0325105 A1 | 10/2014 | Prete | |
| 2015/0067249 A1* | 3/2015 | Wang | G06F 13/1689 711/106 |
| 2018/0374530 A1 | 12/2018 | Jeddeloh | |

\* cited by examiner

*Primary Examiner* — Jay W. Radke
(74) *Attorney, Agent, or Firm* — Winston Hsu

(57) ABSTRACT

A method of memory time division control for a memory system comprising a plurality of memory controllers and memory devices is disclosed. The method comprises assigning a first operation timing to a first memory controller of the plurality of memory controllers and assigning a second operation timing to a second memory controller of the plurality of memory controllers, wherein the first operation timing is interleaved with the time of the second operation timing, transmitting a first chip select signal generated according to the first command signal, to a first memory device of the plurality of memory devices, and transmitting a second chip select signal generated according to the second command signal, to a second memory device of the plurality of memory devices.

9 Claims, 6 Drawing Sheets

METHOD OF MEMORY TIME DIVISION CONTROL AND RELATED DEVICE

BACKGROUND OF THE INVENTION

1. Field of the Invention

The present invention relates to a method of memory control, and more particularly, to a method of memory control with time division mechanism, so as to reduce a number of pins.

2. Description of the Prior Art

In the design of modern electronic systems, the double data rate (DDR) Dynamic Random Access Memory (DRAM) system is often divided into two parts: the memory control logic and the physical layer. A DDR physical interface (DFI) is defined between the memory controller logic and the physical layer to implement standard interconnection. In a word, the DFI interface aims at providing a common interface between the memory control logic and the physical layer, to convert command signal and data signal, transmitted from the memory controller to the memory device, into a specification defined in the memory device (such as a dual in-line memory model, DIMM). Similarly, data signal transmitted from the memory device to the memory controller can be converted to a specification of the memory controller through the DFI interface.

The conventional memory controller can be connected with multiple memory devices (such as the Double-Data-Rate Fourth Generation Synchronous Dynamic Random Access Memory, DDR4). Each time the memory controller transmits a command signal (such as read, write, active, pre-charge, auto-refresh, self-refresh, etc.) to each memory device through the DFI interface. Therefore, every memory device is operated at the same time. For example, a memory controller is connected with three memory devices. The memory controller will receive three times the size of data in the case of the shared command interface when the memory controller reads only one memory device (For the DDR4 to access, such as read/write, 16-bitdata per device, 16 bits*3=48 bits data size is required, therefore increasing the bandwidth). For independently accessing each memory device, an additional command interface is added per device for data shunt method, to reduce the required data size per command interface (only 16 bit*1=16 bit). However, the additional command interface means that the memory controller needs additional pins to control the memory device independently, resulting in limitations on the board layout and increasing cost.

SUMMARY OF THE INVENTION

It is therefore an objective to provide a method of memory time division control and a related device, to solve the above problem.

The present invention discloses a method of memory time division control for a memory system comprising a plurality of memory controllers and memory devices. The method comprises configuring a first operation timing to a first memory controller of the plurality of memory controllers and a second operation timing to a second memory controller of the plurality of memory controllers, wherein the first operation timing and the second operation timing are time interleaved, the first operation timing is used for providing a period for the first memory controller to transmit a first command signal, and the second operation timing is used for providing a period for the second memory controller to transmit a second command signal, transmitting a first chip select signal generated according to the first command signal, to a first memory device of the plurality of memory devices, and transmitting a second chip select signal generated according to the second command signal, to a second memory device of the plurality of memory devices.

The present invention discloses a method of memory time division control for a memory system comprising a plurality of memory controllers. The method comprises receiving a first command signal transmitted by the first memory controller of the plurality of memory controllers and a second command signal transmitted by the second memory controller of the plurality of memory controllers, determining a priority for transmitting the first command signal and the second command signal according to a predetermined priority information, wherein the predetermined priority information indicates a sequence of the plurality of memory controllers or a sequence of a plurality of commands, generating a first chip select signal according to the first command signal with the first transmitting priority, and transmitting the first chip select signal to a first memory device of the memory system, and generating a second chip select signal according to the second command signal with the second transmitting priority, and transmitting the second chip select signal to a second memory device of the memory system.

The present invention discloses a memory system. The memory system comprises a plurality of memory devices, comprising a first memory device and a second memory device, a plurality of memory controllers comprising a first memory controller and a second memory controller, a timing management device, for configuring a first operation timing to the first memory controller and a second operation timing to the second memory controller, wherein the first operation timing and the second operation timing are time interleaved, the first operation timing is used for providing a period for the first memory controller to transmit a first command signal and the second operation timing is used for providing a period for the second memory controller to transmit a second command signal, and a command interface device, for generating a first chip select signal and a second chip select signal according to the first command signal and the second command signal respectively, and for transmitting the first chip select signal and the second chip select signal to the first memory device and the second memory device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
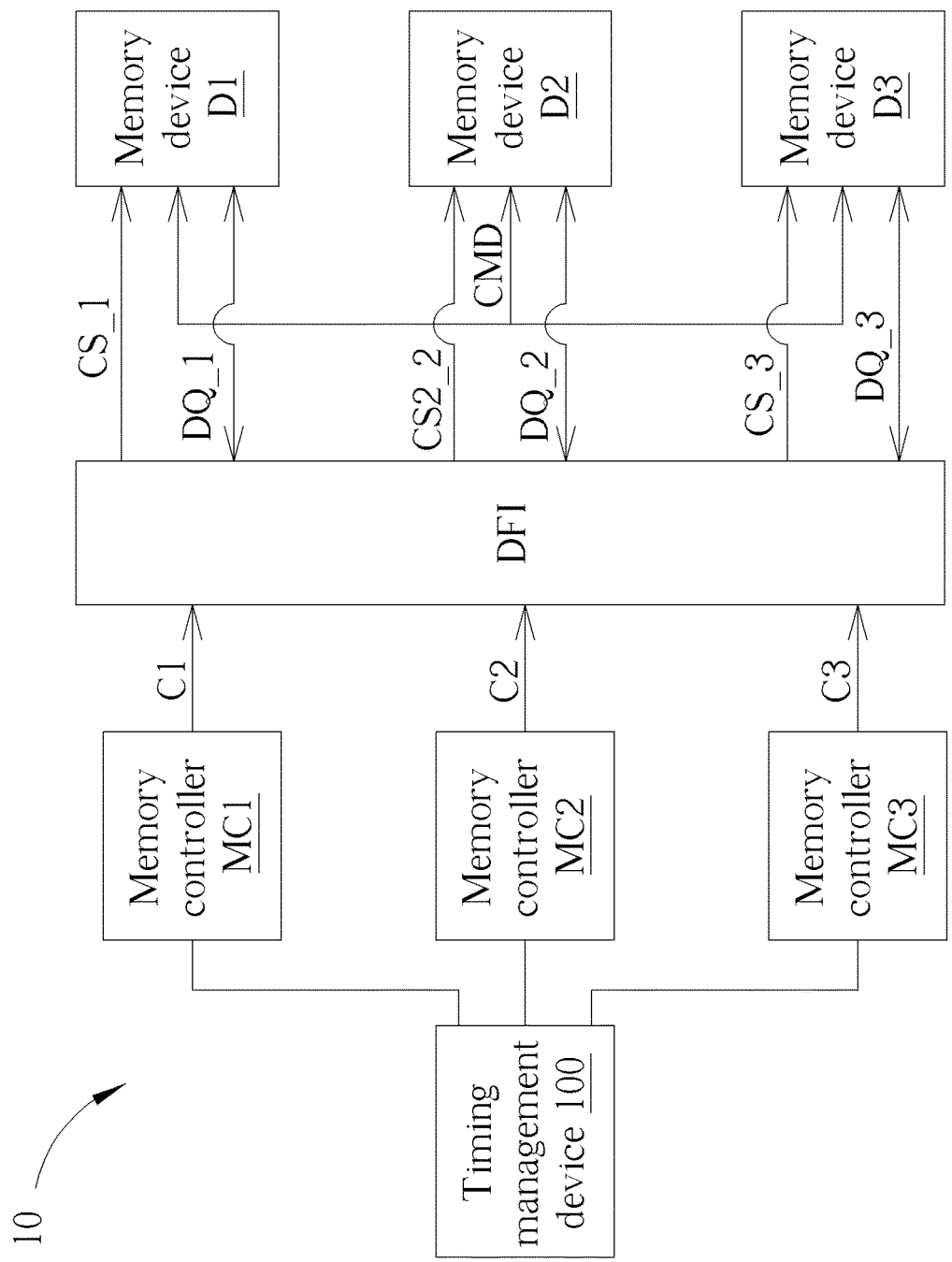
FIG. 1 is a schematic diagram of a memory system according to the present disclosure.

FIG. 1 is a schematic diagram of a memory system 10 according to the present disclosure. The memory system 10 includes the timing management device 100, the memory controllers MC1-MC3, the command interface device DFI and the memory devices D1-D3. The timing management device 100 is used for configuring different operation timings for the memory controllers MC1-MC3 according to a period generated by the clock generator (not shown in figure). For example, timing management device 100 the first operation timing T1 to the memory controller MC1, the second operation timing T2 to the memory controller MC2, and the third operation timing T3 to the memory controller MC3, wherein a length or a time interval of each operation timing is configured according to the length of the period. Thus, memory controller MC1 transmits the command signal C1 at the first operation timing T1, the memory controller MC2 transmits the command signal C2 at the second operation timing T2, and the memory controller MC3 transmits the command signal C3 at the third operation timing. In addition, after the command interface device DFI receives the command signal C1, command signal C2 or command signal C3 (e.g. read, write, active, pre-charge, auto-refresh, self-refresh, etc.), the command interface device DFI converts the command signal to a high level or low level chip select signal CS, row address strobe RAS, column address strobe CAS or write enable signal WE according to an operation indicated by the command signal, so as to transmit to the memory devices D1-D3. Note that, the memory controllers MC1-MC3 share the same command signal line CMD and address signal line ADDR (not shown in figure), but are deployed with independent chip select signal lines CS_1-CS_3, such that the chip select signal could be transmitted with time-sharing mechanism. In a word, the chip select signal of the memory controller MC1 is transmitted to the memory device D1 at the first operation timing T1, so that the memory controller MC1 could access the memory device D1 at the first operation timing T1. Similarly, the chip select signal of the memory controller MC2 is transmitted to the memory device D2 at the second operation timing T2, so that the memory controller MC2 could access the memory device D2 at the second operation timing T2, and likewise or similarly for the chip select signal of MC3. On the other hand, the row address strobe RAS, column address strobe CAS or write enable signal WE of the memory controller MC1, MC2 or MC3 is transmitted to the memory devices D1-D3 at the same time, and thus a common DFI interface is realized in the present disclosure.

Figure 2:
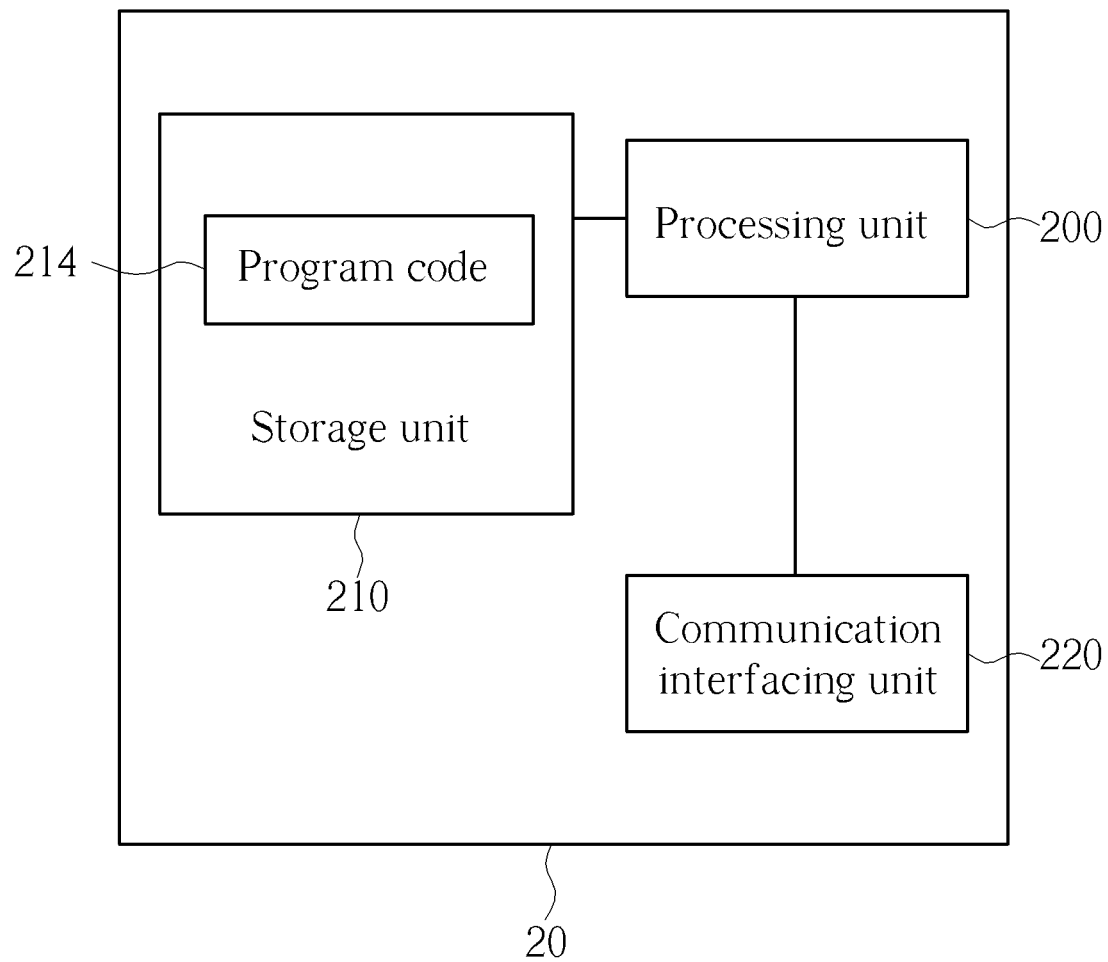
FIG. 2 is a schematic diagram of an electronic device according to the present disclosure.

FIG. 2 is a schematic diagram of an electronic device 20. The electronic device 20 may be the abovementioned timing management device 100 and includes a processing unit 200 such as a microprocessor or Application Specific Integrated Circuit (ASIC), a storage unit 210 and a communication interfacing unit 220. The storage unit 210 may be any data storage device that can store program code 214, for access by the processing unit 200. The communication interfacing unit 220 is connected to a plurality of memory controllers with wired method to exchange signals with the memory controllers according to processing results of the processing unit 200.

Figure 3:
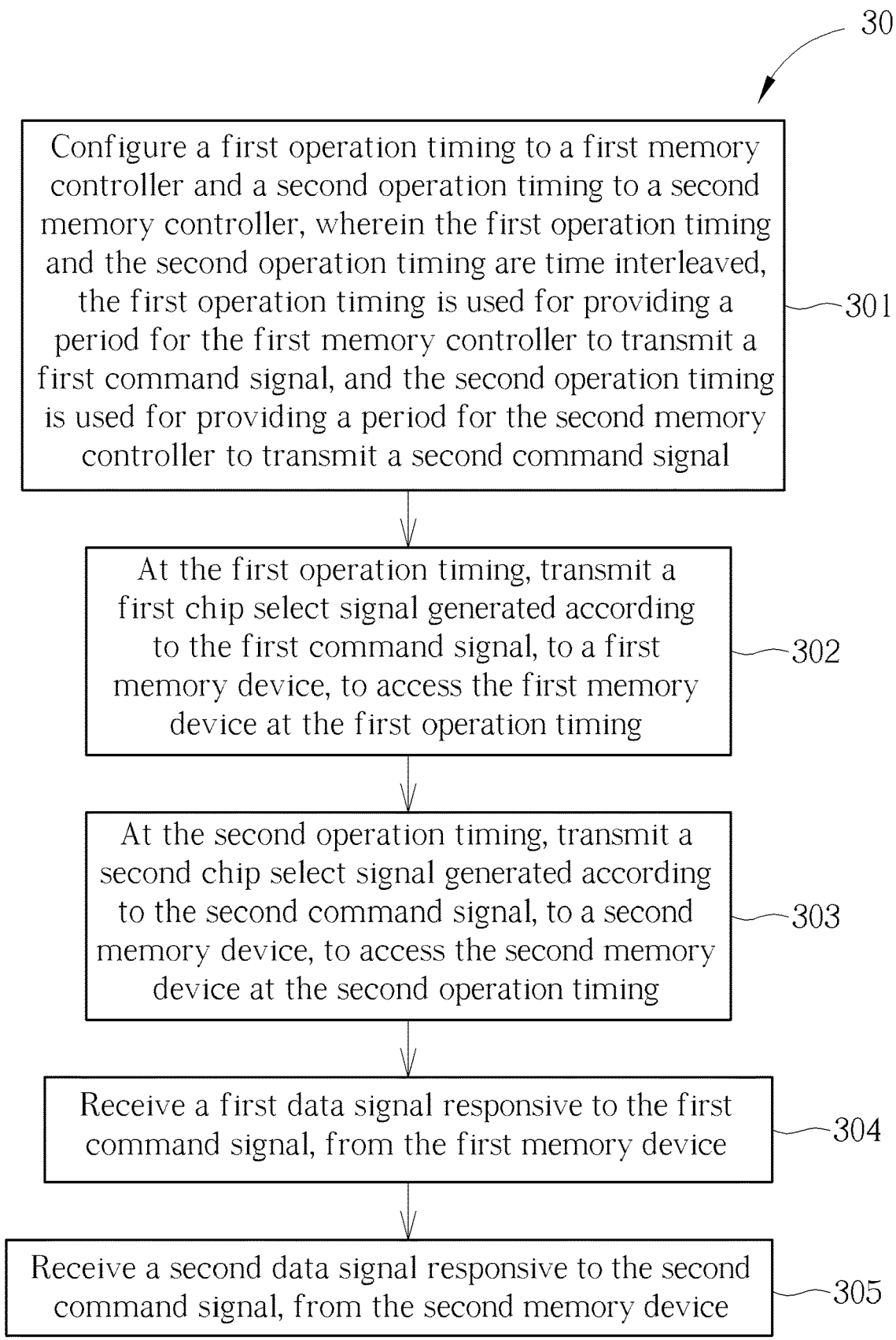
FIG. 3 is a flowchart of time division control process according to the present disclosure.

Please refer to FIG. 3, which is a flowchart of the time division control process 30 according to an embodiment of the present disclosure. The operation of the memory system 10 could be summarized as the time division control process 30, which is compiled into the program code 214 and includes the following steps:

Step 301: Configure a first operation timing to a first memory controller and a second operation timing to a second memory controller, wherein the first operation timing and the second operation timing are time interleaved, the first operation timing is used for providing a period for the first memory controller to transmit a first command signal, and the second operation timing is used for providing a period for the second memory controller to transmit a second command signal.

Step 302: At the first operation timing, transmit a first chip select signal generated according to the first command signal, to a first memory device, to access the first memory device at the first operation timing.

Step 303: At the second operation timing, transmit a second chip select signal generated according to the second command signal, to a second memory device, to access the second memory device at the second operation timing.

Step 304: Receive a first data signal responsive to the first command signal, from the first memory device.

Step 305: Receive a second data signal responsive to the second command signal, from the second memory device.

According to the time division control process 30, the timing management device 100 divides the time sequence on the command interface into multiple time intervals, hereafter called command sequence, for the command signal of the memory controller is transmitted only at the configured time interval. With such manner, multiple memory controllers could share the same command signal line and address signal line, to reduce a number of pins of the memory controller. In addition, every memory controller is deployed with independent chip select signal line corresponding to a memory device, and thus every memory controller performs control operation only at its command sequence and then accesses the memory device with the corresponding chip select signal.

Figure 4:
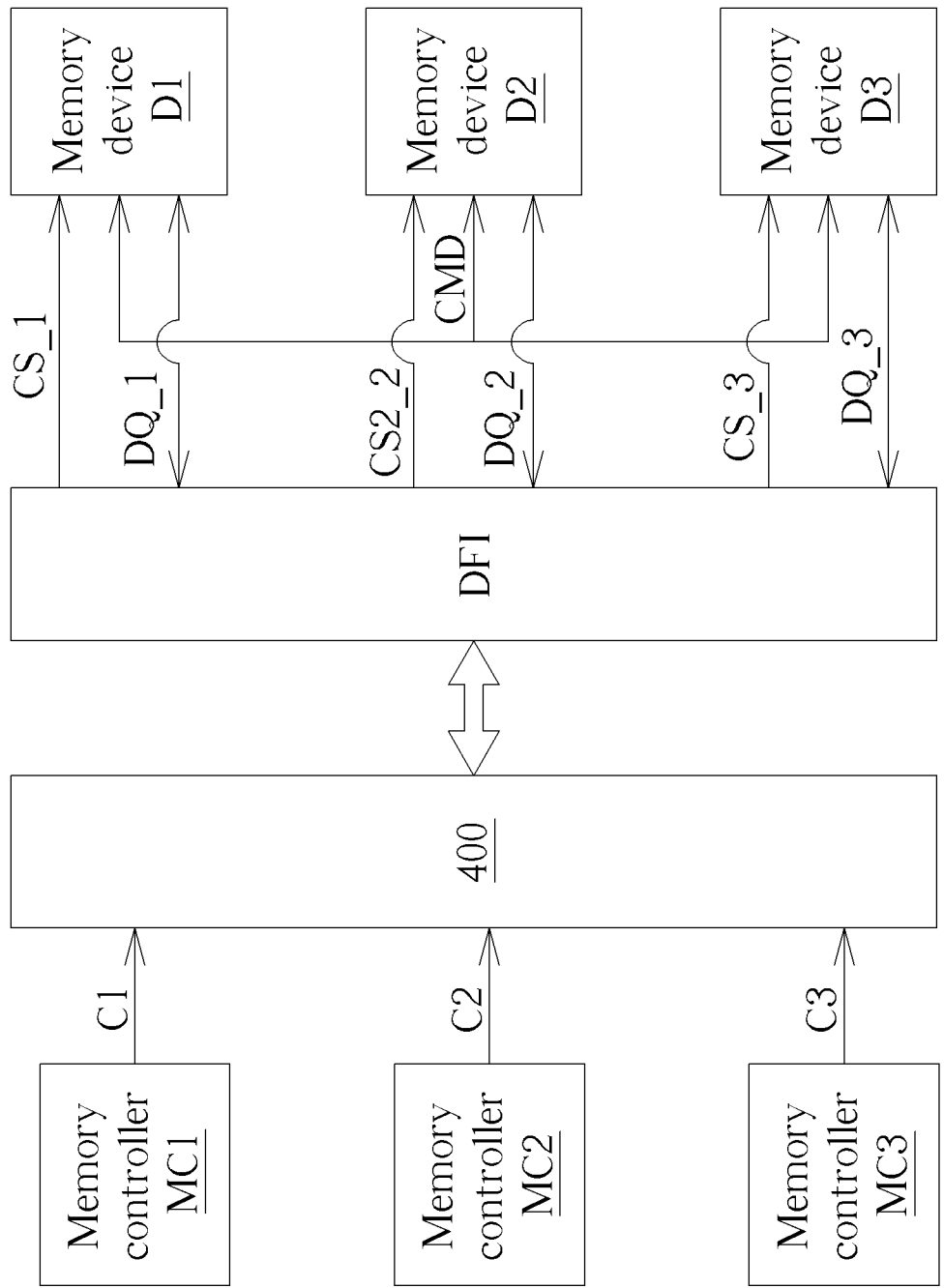
FIG. 4 is a schematic diagram of a memory system according to the present disclosure.

Note that, to realize command signal transmission in time-sharing mechanism, every memory controller could wait for a period of time to transmit the command signal with the configured command sequence, or transmits the command signal with a command priority. FIG. 4 is a schematic diagram of the memory system 40 according to the present disclosure. The memory system 40 includes the memory controllers MC1-MC3, the command management device 400, the memory devices D1-D3 corresponding to the memory controllers MC1-MC3 and the DFI interface. After the command management device 400 receives the command signals from the memory controllers MC1-MC3, the command management device 400 determines the transmission sequence of the received command signals according to the predetermined priority information. For example, the predetermined priority information indicates the sequence of the memory controllers MC1-MC3 or the sequence of the command signal (e.g. read, write, active, pre-charge, auto-refresh, self-refresh, etc.) Thus, after the command management device 400 determines the transmitting priority of the command signals, the command management device 400 transmits the command signals to the DFI interface with the sequence, whereby the DFI interface converts the command signals and transmits the converted command signals to the corresponding memory devices D1-D3.

Figure 5:
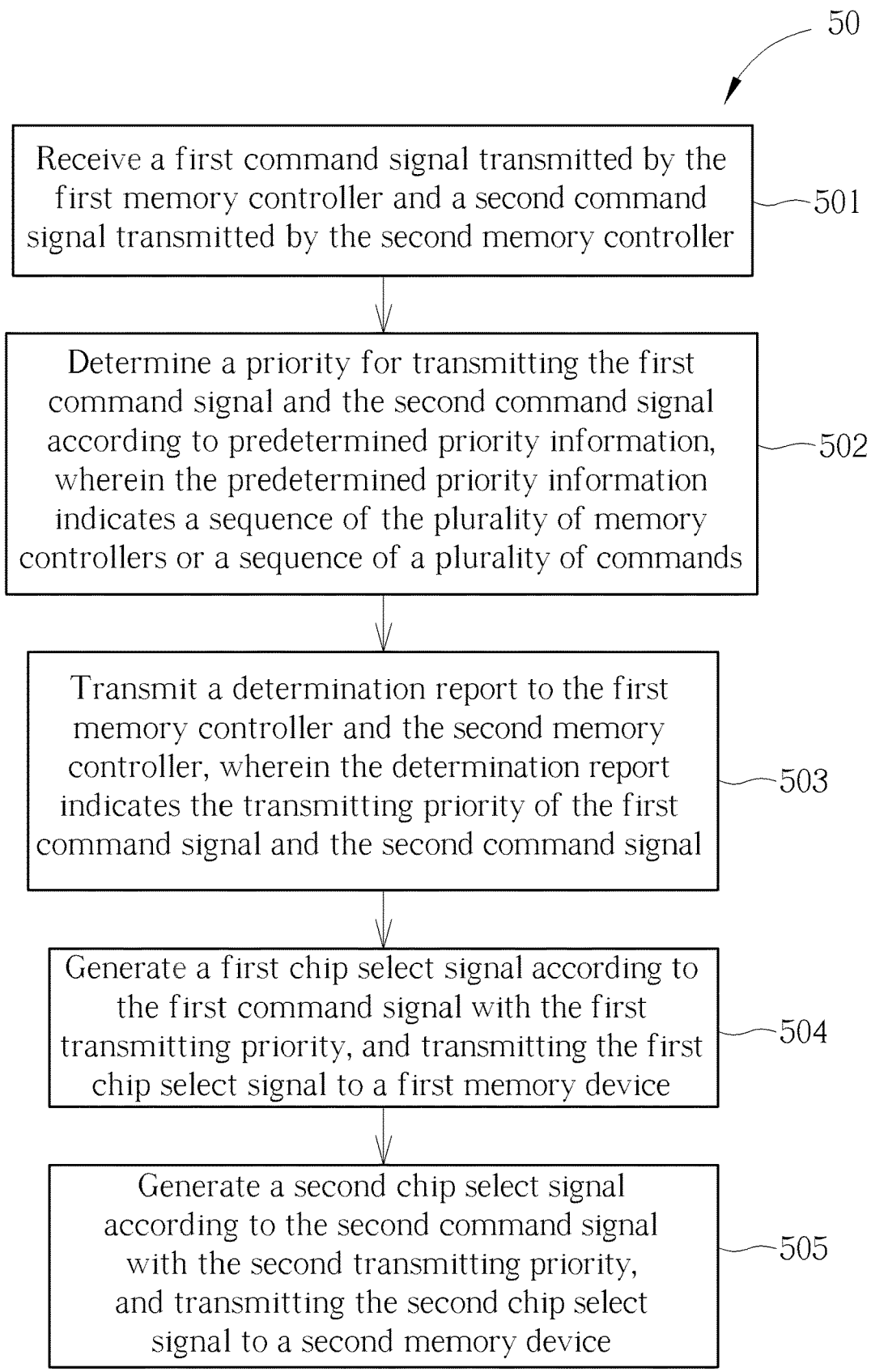
FIG. 5 is a flowchart of time division control process according to the present disclosure.

Please refer to FIG. 5, which is a flowchart of the time division control process 50 according to an embodiment of the present disclosure. The operation of the command management device 400 could be summarized as the time division control process 50 and realized by the electronic device 20 of FIG. 2. That is, the time division control process 50 is compiled into the program code 214 and includes the following steps:

Step 501: Receive a first command signal transmitted by the first memory controller and a second command signal transmitted by the second memory controller.

Step 502: Determine a priority for transmitting the first command signal and the second command signal according to predetermined priority information, wherein the predetermined priority information indicates a sequence of the plurality of memory controllers or a sequence of a plurality of commands.

Step 503: Transmit a determination report to the first memory controller and the second memory controller, wherein the determination report indicates the transmitting priority of the first command signal and the second command signal.

Step 504: Generate a first chip select signal according to the first command signal with the first transmitting priority, and transmitting the first chip select signal to a first memory device.

Step 505: Generate a second chip select signal according to the second command signal with the second transmitting priority, and transmitting the second chip select signal to a second memory device.

According to the time division control process 50, the command transmission sequence is pre-stored in the command management device 400, and thus the command management device 400 determines the output sequence of the command signal according to the priority of the memory controls or the commands. For example, the command management device 400 predefines that the priority of the memory controller MC1 is higher than the memory controller MC2, and the priority of the memory controller MC2 is higher than the memory controller MC3. Thus, the command management device 400 in command sequence first transmits the command signal of the memory controller MC1 to the DFI interface, which generates corresponding chip select signal for transmitting to the memory device D1. In other embodiments, the command management device 400 predefines that the priority of the pre-charge command is higher than the read/write command, and thus the command management device 400 in command sequence first transmits the pre-charge command to the DFI interface to generate corresponding chip select signal for transmitting to the memory device.

Figure 6:
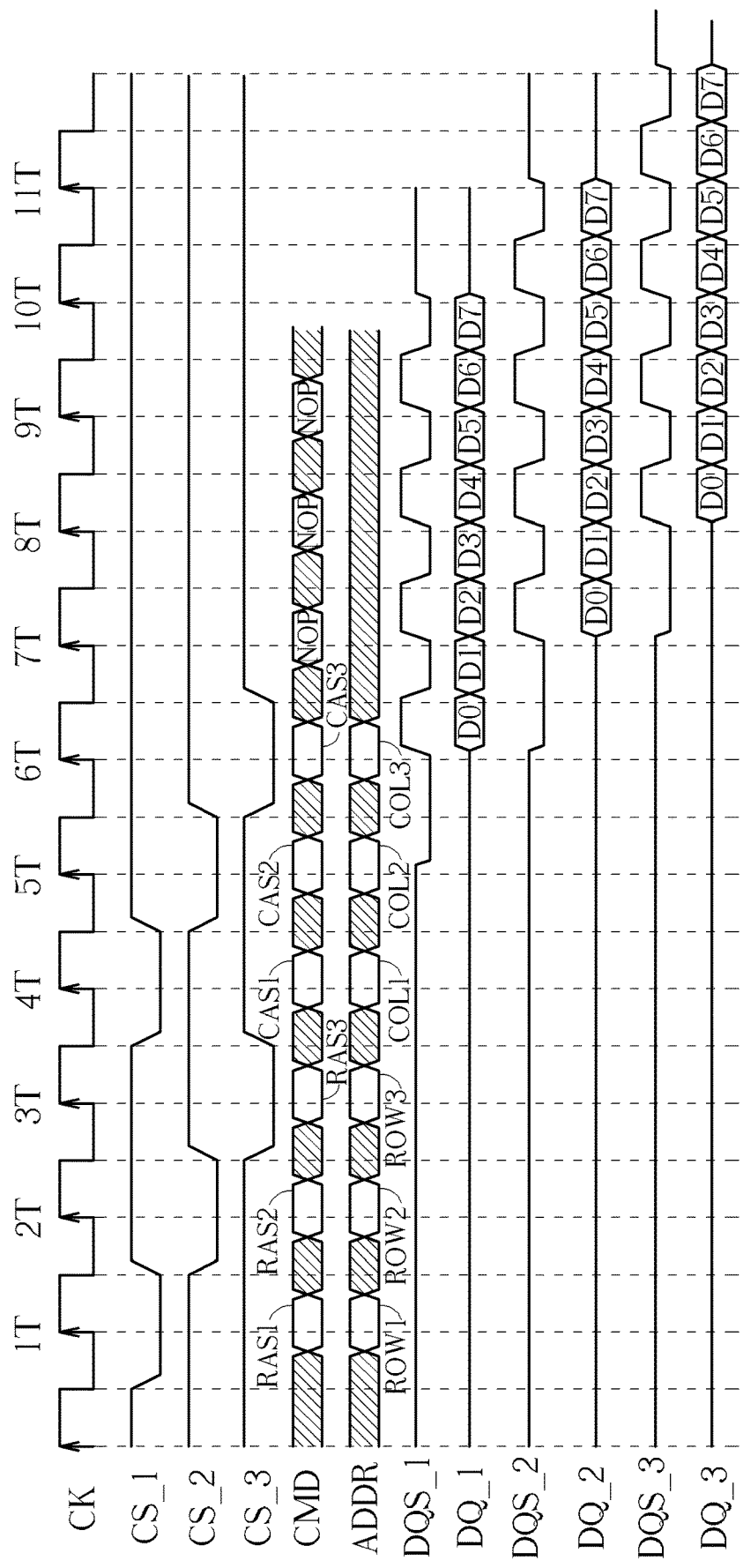
FIG. 6 is a transmission sequence according to the present disclosure.

Reference is made to FIG. 6, which is a transmission sequence according to the present disclosure. In FIG. 6, the chip select signal lines CS_1-CS_3, the data strobe lines DQS_0-DQS_2 and the data signal lines DQ_1-DQ_2 are independently deployed, whereas the command signal line CMD and address signal line ADDR are shared by the memory controllers MC1-MC3. Note that, the timings of the abovementioned signal lines shall be based on the period of the clock signal CK. In an embodiment, the memory controller MC1 in the command sequence 1T transmits the command signal, the row address strobe RAS1 and the row address ROW1 to the memory devices D1-D3 on the common command signal line CMD and the address signal line ADDR, and transmits the chip select command to the memory device D1 on the independent chip select signal line CS_1. Similarly, the memory controllers MC2 and MC3 respectively in command sequences 2T and 3T transmit the row address strobes RAS2 and RAS 3 and the row addresses ROW2 and ROW3 on the common command signal line CMD and the address signal line ADDR, and transmit the chip select commands to the memory devices D2 and D3 on the independent chip select signal lines CS_2 and CS_3. After the row address strobe and row address is transmitted, the memory controllers MC1-MC3 respectively in the command sequences 4T-6T transmit the column address strobes CAS1-CAS3 and column addresses COL1-COL3 to the memory devices D1-D3 on the common command signal line CMD and the address signal line ADDR. Meanwhile, the memory controllers MC1-MC3 respectively in command sequences 4T-6T transmit chip select signals to the memory devices D1-D3 on independent chip select signal lines CS_1-CS_3. Therefore, the memory device D1 is triggered only in command sequences 1T and 4T, and responds or writes data D0-D7 on the data signal line DQ_1. In other words, with common command interface layout, the memory devices D2-D3 are not triggered to perform an operation corresponding to the command signal transmitted by the memory controller MC1. Similarly, the memory device D2 is triggered only in command sequences 2T and 5T, and therefore responds or writes data D0-D7 on the data signal line DQ_2; the memory device D3 is triggered only in command sequences 3T and 6T, and therefore responds or writes data D0-D7 on the data signal line DQ_3.

The abovementioned steps of the processes including suggested steps can be realized by means that could be a hardware, a firmware known as a combination of a hardware device and computer instructions and data that reside as read-only software on the hardware device or an electronic system. Examples of hardware can include analog, digital and mixed circuits known as microcircuit, microchip, or silicon chip. Examples of the electronic system can include a system on chip (SOC), system in package (SiP), a computer on module (COM) and the memory system 10 and 40.

In conclusion, the present disclosure discloses a method and apparatus for controlling memory with time division, which can independently control each memory device in the case where the memory controller shares the command interface, thereby reducing the bandwidth required for memory access operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of memory time division control for a memory system comprising a plurality of memory controllers and memory devices, the method comprising:
    configuring a first operation timing to a first memory controller of the plurality of memory controllers and a second operation timing to a second memory controller of the plurality of memory controllers, wherein the first operation timing and the second operation timing are time interleaved, the first operation timing is used for providing a period for the first memory controller to transmit a first command signal, and the second operation timing is used for providing a period for the second memory controller to transmit a second command signal;
    transmitting a first chip select signal generated according to the first command signal, to a first memory device of the plurality of memory devices; and
    transmitting a second chip select signal generated according to the second command signal, to a second memory device of the plurality of memory devices.

2. The method of claim 1, further comprising:
receiving a first data signal responsive to the first command signal, from the first memory device; and
receiving a second data signal responsive to the second command signal, from the second memory device.

3. The method of claim 2, wherein the first command signal or the second command signal comprises a row address strobe (RAS), column address strobe (CAS) and chip select signal (CS).

4. A method of memory time division control for a memory system comprising a plurality of memory controllers, the method comprising:
receiving a first command signal transmitted by a first memory controller of the plurality of memory controllers and a second command signal transmitted by a second memory controller of the plurality of memory controllers;
determining a priority for transmitting the first command signal and the second command signal according to a predetermined priority information, wherein the predetermined priority information indicates a sequence of the plurality of memory controllers or a sequence of a plurality of commands;
generating a first chip select signal according to the first command signal with a first transmitting priority, and transmitting the first chip select signal to a first memory device of the memory system; and
generating a second chip select signal according to the second command signal with a second transmitting priority, and transmitting the second chip select signal to a second memory device of the memory system.

5. The method of claim 4, wherein the step of determining the priority for transmitting the first command signal and the second command signal according to the predetermined priority information comprises:
determining the first command signal generated by the first memory controller has the first transmitting priority according to the sequence of the plurality of memory controllers indicated in the predetermined priority information; or
determining the first command signal has the first transmitting priority according to the sequence of a plurality of commands indicated in the predetermined priority information.

6. The method of claim 4, further comprising:
transmitting a determination report to the first memory controller and the second memory controller, wherein the determination report indicates the transmitting priority of the first command signal and the second command signal generated by the first memory controller and the second memory controller.

7. A memory system comprising:
a plurality of memory devices, comprising a first memory device and a second memory device;
a plurality of memory controllers comprising a first memory controller and a second memory controller;
a timing management device, for configuring a first operation timing to the first memory controller and a second operation timing to the second memory controller, wherein the first operation timing and the second operation timing are time interleaved, the first operation timing is used for providing a period for the first memory controller to transmit a first command signal and the second operation timing is used for providing a period for the second memory controller to transmit a second command signal; and
a command interface device, for generating a first chip select signal and a second chip select signal according to the first command signal and the second command signal respectively, and for transmitting the first chip select signal and the second chip select signal to the first memory device and the second memory device.

8. The memory system of claim 7, wherein the command interface device is a DDR PHY interface (DFI).

9. The memory system of claim 7, wherein the first memory controller receives a first data signal responsive to the first command signal, from the first memory device and second memory controller receives a second data signal responsive to the second command signal, from the second memory device.

* * * * *